United States Patent [19]

Drozdowicz et al.

[11] Patent Number: 4,778,693

[45] Date of Patent: Oct. 18, 1988

[54] PHOTOLITHOGRAPHIC MASK REPAIR SYSTEM

[75] Inventors: Zbigniew Drozdowicz, Stony Brook; Harvey Stone, Flushing; John Vogler, Smithtown, all of N.Y.

[73] Assignee: Quantronix Corporation, Smithtown, N.Y.

[21] Appl. No.: 919,975

[22] Filed: Oct. 17, 1986

[51] Int. Cl.⁴ .................. B05D 3/06; B32B 35/00; B23K 9/00

[52] U.S. Cl. .................. 427/53.1; 219/121.6; 219/121.85; 219/121.76; 219/121.83; 427/140; 427/142; 430/5; 430/945

[58] Field of Search ............. 427/53.1, 140, 142; 430/5, 945; 219/121 L, 121 LM, 121 LS, 121 LZ

[56] References Cited

U.S. PATENT DOCUMENTS

| 4,543,270 | 9/1985 | Oprysko et al. | 427/53.1 |
| 4,573,465 | 3/1986 | Sugiyana et al. | 219/121 LS |
| 4,609,566 | 9/1986 | Hongo et al. | 427/53.1 |
| 4,636,403 | 1/1987 | Fisanick et al. | 427/53.1 |
| 4,655,590 | 4/1987 | Aagano et al. | 219/121 LS |

Primary Examiner—Michael Lusignan
Attorney, Agent, or Firm—Kane, Dalsimer, Sullivan, Kurucz, Levy, Eisele and Richard

[57] ABSTRACT

A method and device are provided to accomplish laser driven pyrolytic, photolytic and photoactivativation process requiring controlled atmosphere without the use of gas tight cells.

A method and device are provided to correct clear faults on a photo-lithographic mask by metallic deposition on the mask at standard temperature and pressure. The deposition is formed by the pyrolytic decomposition of an organometallic gas mixture which may include chromium and molybdenum hexacarbonyls, and a buffer gas. The decomposition is done utilizing a laser beam. The device may be incorporated into a system which has other members used to correct opaque faults in the same mask.

19 Claims, 9 Drawing Sheets

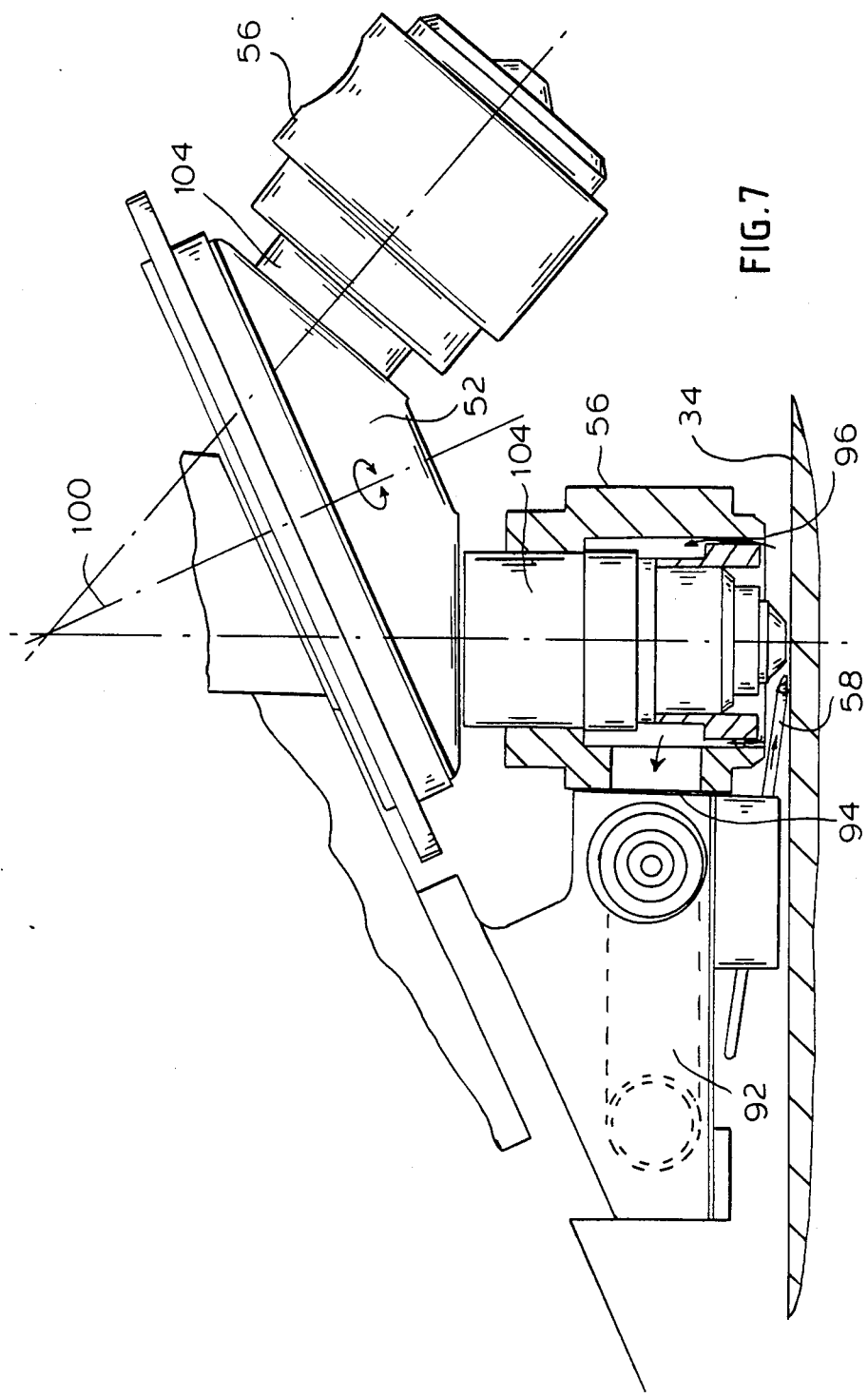

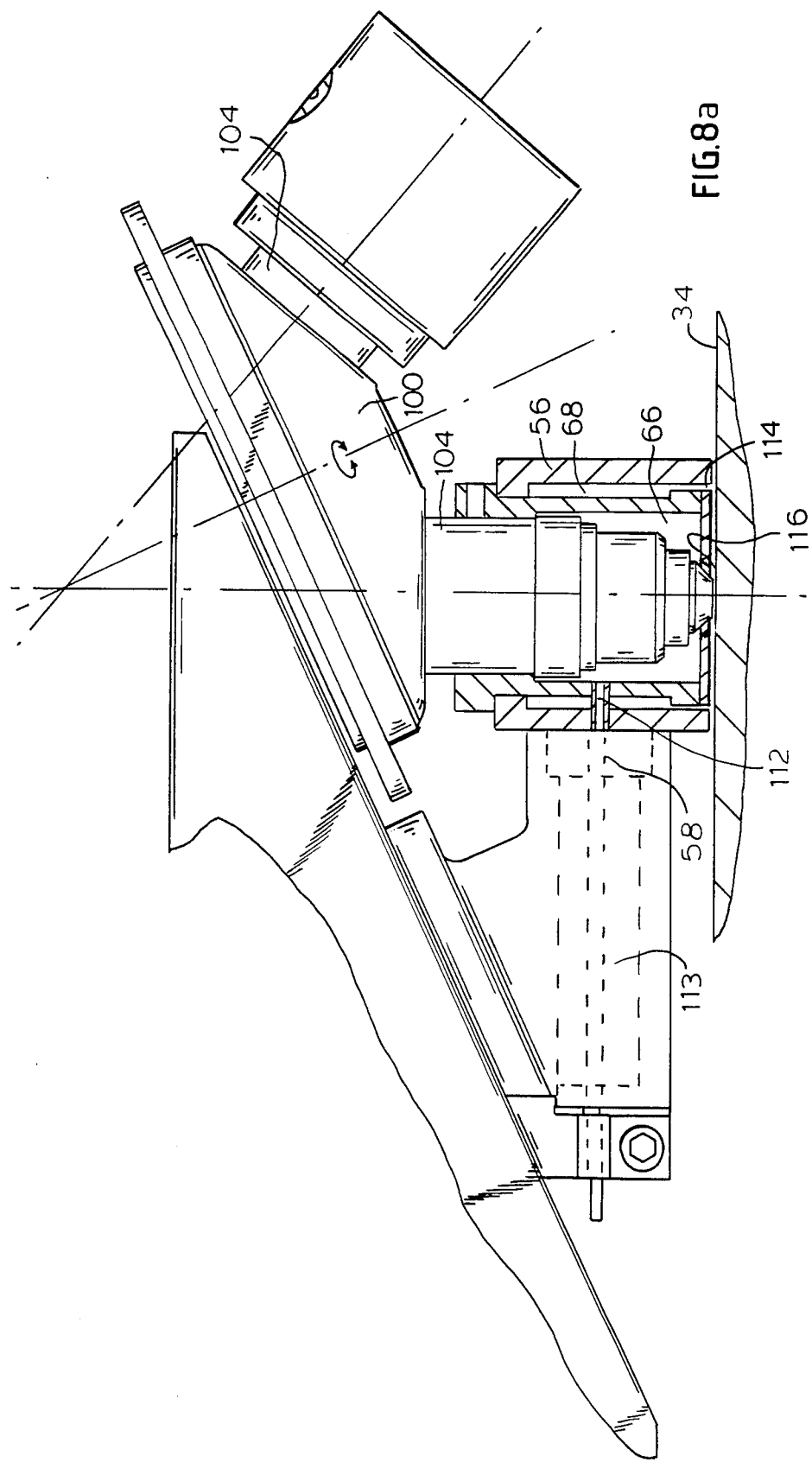

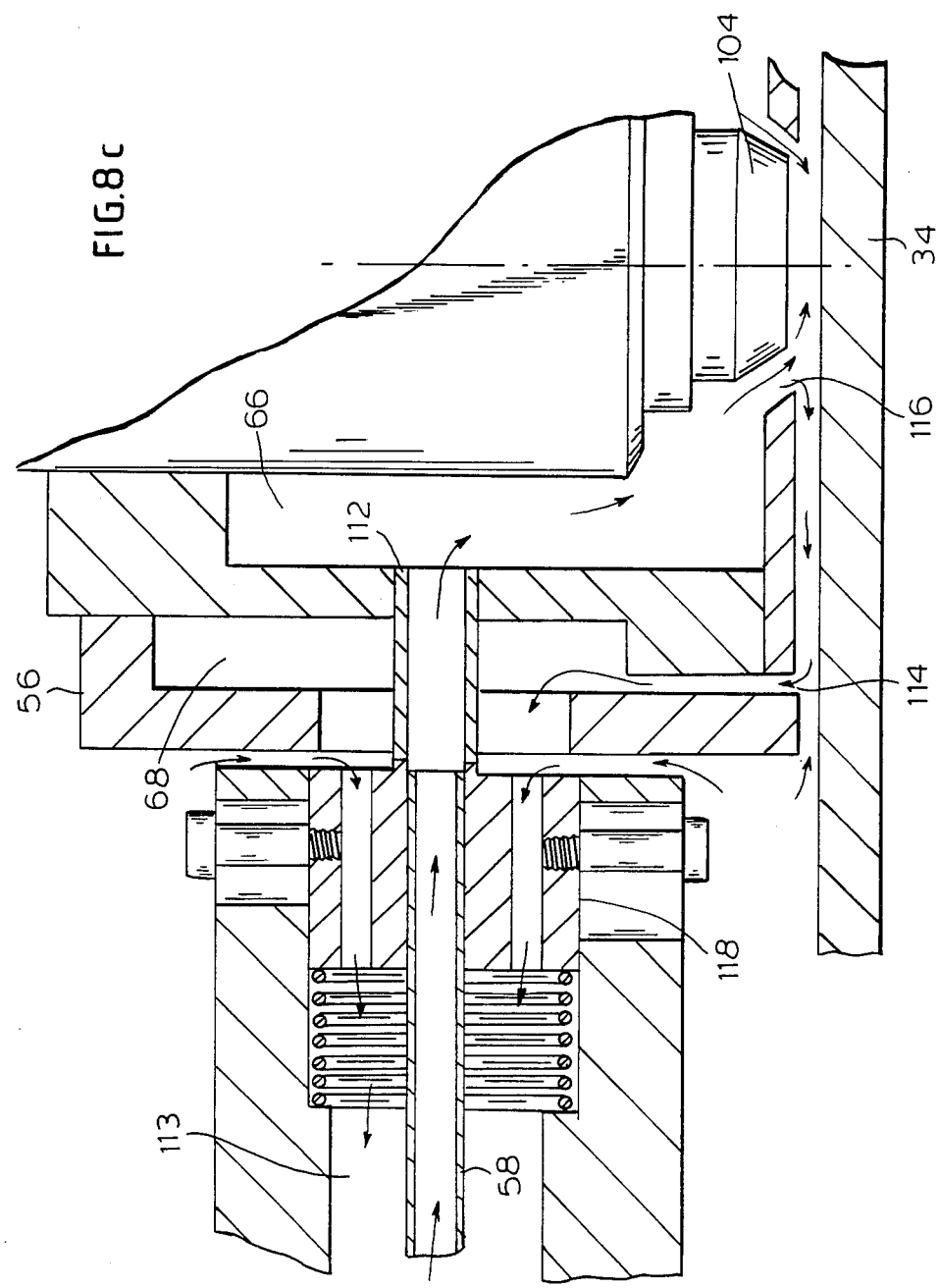

PHOTOLITHOGRAPHIC MASK REPAIR SYSTEM

BACKGROUND OF THE INVENTION

1. Field of Invention

This invention pertains to a method for creating a volume of controlled atmosphere without the use of a full enclosure, and more particularly, to a system which creates a controlled gas atmosphere under any of the microscope objectives mounted on a standard microscope nosepiece. Any of the objectives can then be used to deliver laser radiation of appropriate wavelength and beam shape. The system can be used to photolytically and/or pyrolytically decompose suitable gaseous materials contained in the gas atmosphere or photoactivate a surface in the microscope objective focus plane to modify the reaction rates between the surface and the surrounding gas. This method allows for exclusion of air from the gas atmosphere. Also described is a specific source of gaseous atmosphere allowing repairs of clear defects in photolithographic masks used for making electronic integrated circuits. Also described is a method of preventing objective damage, in photolytic processes, due to material deposition on the lens or other transparent or reflective surfaces.

2. Description of the Prior Art

Laser initiated reactions, leading to localized deposition of particular metal or semiconductor substances on top of various substrates or leading to localized etching of surfaces, are becoming more and more widely used in the semiconductor industry. See, for recent reviews, "Laser generated microstructures" by Y. Ritz-Froidevaux et al, Applied Physics A, vol. 37, pp. 121-138, 1985, "Laser-induced chemical vapor deposition" by Raj Solanki et al, Solid State Technology, pp. 220-227, June 1985, "A review of laser-microchemical processing" by D. J. Ehrlich et al, J. Vacuum Science and Technology B, vol. 1, pp. 969-984, 1983. These reactions require specific atmospheric conditions to produce the desired results. Vacuum tight cells, with their associated heat- and fume-producing and noisy vacuum pumps are typically used to facilitate atmospheric control (See for example U.S. Pat. No. 4,340,617, U.S. Pat. No. 4,451,503, U.S. Pat. No. 4,525,379, and U.S. Pat. No. 4,465,529). Proper gas mixes are introduced into the cells after evacuation using either a flow-through or sealed-off mode of operation. Laser radiation, introduced through a focusing optical system and the cell window, is then typically used to activate the process by decomposing some components of the gas mixture in the gas phase or after adsorption on the surface. The products of decomposition then create deposits or etch effects. Substrate activation effects, which make the locally activated region preferentially susceptible to etch effects by the surrounding gas phase, can also be produced by laser irradiation. Spatial resolution achievable with a given process is typically limited by the fact that the microscope focusing objective has to be able to accommodate cell window thickness. This large working distance usually reduces the numerical aperture (N.A.) to a lower value than might be desirable.

Photolithographic mask repair, an application in the semiconductor industry, is addressed in U.S. Pat. No. 4,543,270 and "One-step repair of transparent defects in hard-surface photolithographic masks via laser photodeposition" by D. J. Ehrlich et al, IEEE Electron Device Letters, vol. EDL-1, pp. 101-103, 1980. In both of these references, specific gas cells are described. Ehrlich et al also give a possible approach to minimize on-the-window deposits when a photolytic repair process is used. Their approach uses a highly-convergent laser beam with much lower power density on the window resulting in a reduced deposition rate there. This method delays but does not eliminate deterioration of window transmission due to the photolytic deposition process.

OBJECTIVES AND SUMMARY OF THE INVENTION

A principal objective of the present invention is to provide a method for lowering the cost and improving the throughput and spatial resolution of laser-initiated photolytic and/or pyrolytic reactions by removing the need for providing a gas-tight cell with its associated vacuum equipment.

A further objective is to provide a method and device which allows the use of toxic substances in the process without endangering the operator.

Another objective is to provide a means of protecting the microscope objective from deposits, detrimental to its optical functions, caused by photolytic decomposition processes without the introduction of any extra transparent surfaces which would themselves be in turn exposed to the optically-detrimental deposits.

Yet another objective is to provide a convenient source material to be used in laser driven repairs of clear defects on photolithographic masks.

And yet another objective is to provide a device which can be readily integrated with a device for correcting opaque defects on photolithographic masks which device requires the highest possible numerical aperture microscope objectives for submicron repair capabilities.

In accordance with the present invention, for a pyrolytic repair process, a one- or multi-layer shroud is placed around the particular microscope objective and a stream of process gas is injected under the objective or into one of the shroud volumes. The net effect is to replace the air under the objective with the proper mixture of process and buffer gases. Ten cc/min. gas flows are typically sufficient to replace most of the air under a high magnification microscope objective when the gas is directed there by a properly pointed 0.010 in i.d. nozzle. One hundred cc/min flows are typical of shroud filling and area flooding approaches. An exhaust system is then used to pick up all the process gases and the gaseous decomposition products to protect the operators from possibly toxic substances. Such an exhaust system consists typically of a shroud concentric with the objective and attached to a source of slightly negative pressure, such as a "House vent" or the input to an exhaust fan. Proper filters and/or neutralizing devices can be used to make the exhaust safe for emission into the outside air.

A microscope utilizes typically a number of objectives of varying magnification. These are usually mounted on a rotating nosepiece. Each of these objectives can be brought into use by rotating the nosepiece. Any and all of the standard objectives can be enclosed by gas-containing-shrouds according to the present invention. Any one of such shrouded microscope objectives can be rotated into the process position and used safely and efficiently.

A specific system used for clear defect repair on photolithographic masks consists of such a shroud-surrounded microscope objective delivering a focused 488 nanometer wavelength beam from an Argon laser to the surface of a photolithographic mask. The interaction of this approximately 10 milliwatt beam, focused to about 1 micrometer diameter, with a metal feature on the mask produces a high temperature spot. This spot becomes the starting point for pyrolytic decomposition, similar to the method of U.S. Pat. No. 4,543,270.

The metal film deposits produced by this method, when extended over adjacent clear (missing chrome) defect areas, make these clear areas opaque, thus effecting the repair.

A mixture of sublimed phases of hexacarbonyls of chromium and molybdenum is carried to the objective area by a nonoxidizing carrier gas, e.g. Argon, and serves as a source for the metal deposits. Molybdenum provides better quality deposited films while chromium provides improved resistance to the typical chemical cleaning agents, such as hot mixtures of chromic and sulfuric acids, used in processing of photolithographic masks. A venting arrangement, drawing in about 2 cubic feet per minute of ambient air, together with the process gases and their by-products, is used as described above to keep these toxic gases away from the operator. The effluents are processed through activated charcoal filters to remove the remnants of toxic gases before they are emitted into the house vent.

Clear defect repairs, produced as described above, extend on occasion into areas that are supposed to remain clear. At such times, an opaque defect repair process is used to remove the excess material and produce good edge definition. This process, which employs a high intensity laser pulse to vaporize the unwanted metal film, is described in detail by M. G. Cohen et al "Micro-Materials Processing", Proceedings of IEEE, Vol. 70, pp 545-555, 1982, E. G. Arthurs "Precision laser micromachining for semiconductor production", paper 2C-3 at ICALEO'82, Boston, Mass., Sept. 20-23, 1982, and P. H. Singer "Photomask and Reticle Repair: Equipment and Techniques", Semiconductor International, pp 79-90, September, 1982. Edge definition, position and level of irregularity strongly depend on the resolving power of the microscope objective used, i.e. on its Numerical Aperture (N.A.). A typical high N.A. objective is a 100X, 0.95 N.A. unit with 0.012 in. working distance. Increasing the working distance to allow for a cell window will generally require use of an objective with lower N.A. and thus, also reduced resolution. The present invention, by allowing windowless clear defect repair, preserves the high resolution opaque repair capability on the same system. Further advantage is provided by dispensing with the need for vacuum hardware and pumps and the reduction in throughput associated with making and breaking of vacuum tight seals for insertion and removal of the mask into and out of the cell.

The specific objective protection scheme for photolytic processes involves a similar setup to that for pyrolysis but includes an extra chamber 132 in FIG. 10 or the inner, open chamber of reflective objective in FIG. 11 with a hole through which a small amount of buffer gas alone, e.g. Argon gas, is supplied through 158 to keep the decomposable components of process gas away from sensitive surfaces. Flow rates are adjusted so that the extra buffer gas flow does not displace too much of the process gas in the microscope focal region. A 5cc/min extra buffer gas flow is typical for a 3 mm diameter opening (138 in FIG. 10). When a reflective objective is used instead of a refractive one, as is frequently the case when using ultraviolet light sources, the objective itself can be flooded by the gentle flow of buffer gas to protect its reflective surfaces from the process gas.

BRIEF DESCRIPTION OF THE FIGURES

FIG. 7 shows details of a microscope and shroud in accordance with the embodiment of FIG. 2;

DETAILED DESCRIPTION OF THE INVENTION

A combined mask correcting system for clear and opaque defects shall now be described in conjunction with FIG. 1; however, it should be understood that, except as noted, a system for correcting only clear defects would be essentially identical.

Figure 1:
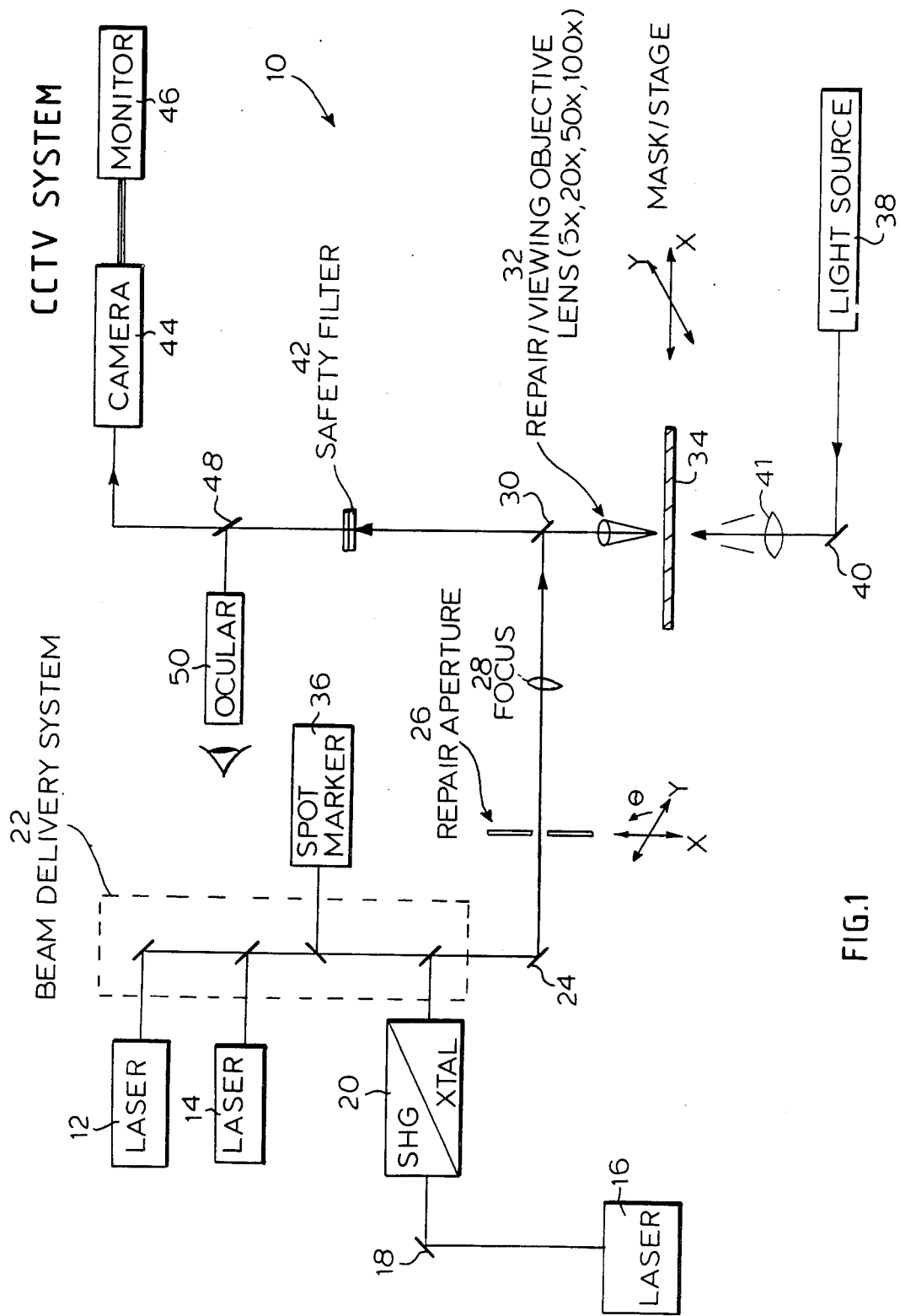
FIG. 1 shows an optical schematic diagram for a combined clear and opaque defect correcting system constructed in accordance with the invention.

In FIG. 1, a mask-defect correcting system 10 is illustrated having three lasers: an argon laser 12 operated at 488 nm, a helium-neon 633 nm pointing laser 14, and an Nd:YAG laser 16 operated at 1064 nm. A mirror 18 directs the output of Nd:YAG laser 16 to a Second Harmonic Generator crystal 20 which in response generates a coherent beam at 532 nm. The beams from lasers 12, 14 and crystal 20 are directed by a common optical beam delivery system 22, containing a number of lenses used to adjust the size and divergence of the various laser beams, along a common axis, serially to a mirror 24, repair aperture 26, focusing lens 28, mirror 30 and objective lens 32 which focuses the beams onto mask 34. Laser 14 is provided to show the location of a laser 12 beam, not visible due to safety filter 42, on the mask. A spot marker (an incoherent tungsten-halogen source) 36 is included to indicate a target spot on the mask for opaque defect repair.

Light from a tungsten-halogen light source 38 is used to illuminate mask 34 from below via mirror 40 and condenser lens 41 so that the opaque and clear regions of the mask are clearly visible in ocular 50. Mirror 30 is semi-transparent so that the image of the mask is transmitted upwards through mirror 30, a safety filter 42, to a video camera 44.

The picture generated by video camera 44 is displayed by video monitor 46. Between filter 42 and camera 44 a second semi-transparent mirror 48 also projects the image of the mask toward ocular lens 50 for direct viewing. If a beam having a specific shape (i.e. rectangular) is required, aperture 26 may be shaped accordingly. Objective lens 32 may be selected to have a magnification of for example 5×, 20×, 50× or 100×.

During the operation of the system, either argon laser 12 or Nd:YAG laser 16 is used depending on the particular defect on mask 34. More particularly, for an opaque defect, the frequency doubled output of the Nd:Y laser is used to vaporize the unwanted opaque film on the mask. For clear defects, argon laser 12 is used as described below.

Figure 2:
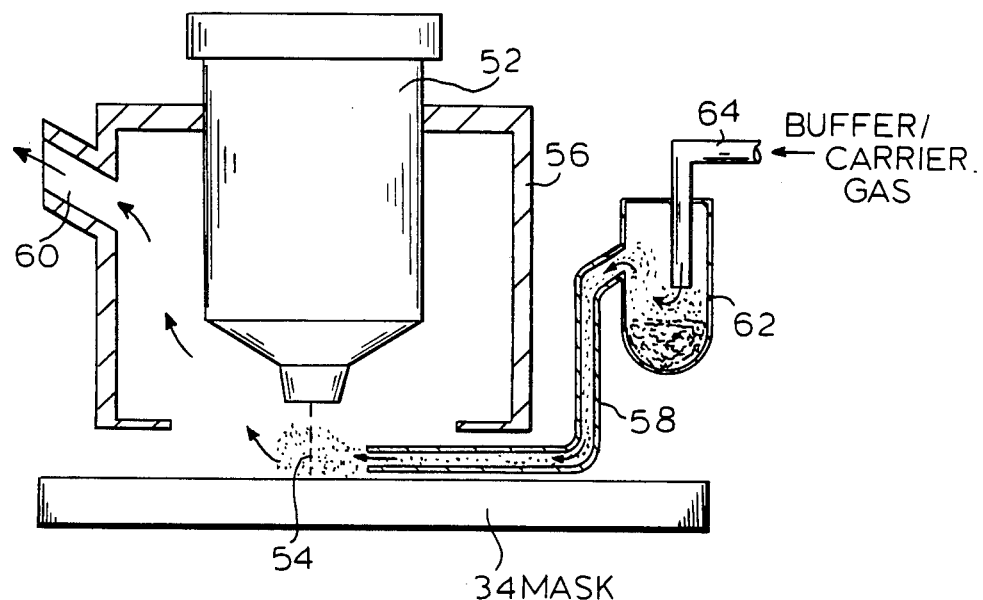
FIG. 2 shows a schematic view of an initial embodiment of the invention.

In FIG. 2, a typical 100 microscope objective 52 is used to direct combined laser beams 54 to mask 34. The objective is typically disposed at a working distance of about 0.012 in. from the mask. A shroud 56 envelopes the objective and the immediate area of the mask surrounding the work area, i.e. the region of the mask with a defect. The shroud 56 is penetrated by an exhaust pipe 60. Delivery pipe 58 is connected to a container 62 which may contain a premixed gaseous compound including both organometallic compounds and a carrier/buffer gas. Alternatively, container 62 may contain only the organometallic compounds, in which case a pipe 64 may be used to provide the buffer/carrier gas. Pipe 58 brings the process gas mixture to the volume between objective 52 and mask 34.

It was found that the process gas (PG) preferably comprises a mixture of the sublimated phase of hexacarbonyls of chromium and molybdenum [Cr(Co)$_6$ and Mo(Co)$_6$] at or near room temperature. Chromium has been included because it typically forms the opaque patterns on the mask as manufactured. Furthermore, chromium deposits resist all normal mask cleaning procedures. However, laser-deposited chromium tends to form granular films. Laser-deposited molybdenum forms smoother films but pure molybdenum deposits are easily removed by normal mask-cleaning processes. It was found that the combination of chromium and molybdenum compounds produces films which retain the good properties of the individual deposits. Both metal carbonyls are crystalline in nature, have a low vapor pressure at room temperature and therefore are easy to handle.

The buffer/carrier gas is used as a means to propel the vapor phases of the organometallic compounds into the shroud at atmospheric pressure. The buffer/carrier gas may include helium, argon, nitrogen, etc. While air has also been used successfully, it was found that it is somewhat less effective in producing uniform metallic deposits than the previously mentioned gases.

Preferably the following PG composition, consisting of nearly saturated vapor phases of the carbonyls near room temperature, is used:

|  | Partial pressure (Torr) |
| --- | --- |
| Chromium hexacarbonyl | 0.2 |
| Molybdenum hexacarbonyl | 0.2 |
| Buffer/carrier (Argon) | 760 |

The gas mixture described above is fed through pipe 58 into the region lying between the mask 34 and objective 52. When the Argon laser beam 54 is activated for a period of a few seconds, its focused beam heats approximately one square micrometer area of the surface of mask 34 to above 150° C., causing the hexacarbonyls to decompose at that spot, thereby forming a metallic layer on mask 34. Unused PG, buffer/carrier gas and the gases produced by the decomposition are removed through pipe 60.

In the embodiment of FIG. 2, the concentration of the delivered gas mixture in the volume between the objective 52 and mask 34 is dependent on the exact orientation of pipe 58. Another embodiment, FIG. 3, alleviates that dependence as follows. A cylindrical chamber 66 is formed within the shroud 56 to contain the gas from pipe 58 within the immediate vicinity of objective 52 and mask 34 and deliver it with approximately cylindrical symmetry as shown. An annular chamber 68 is then formed between shroud 56 and inner chamber 66 in which the exhaust gases can collect before being removed through pipe 60.

Figure 4:
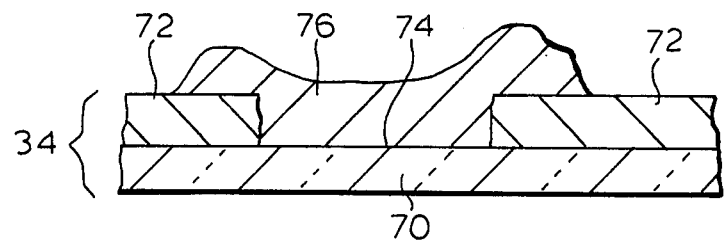
FIG. 4 shows a side-sectional view of a mask repaired in accordance with this invention.

The operation of the device is graphically illustrated in FIG. 4. In this Figure, mask 34 includes a transparent quartz substrate 70 with a chrome-based opaque layer 72, said layer containing a transparent opening 74. Opening 74 is covered by added portion 76 which comprises a mixture of chromium and molybdenum in accordance with the present invention.

Preferably, portion 76 partially overlaps layer 72 as shown, so that said portion is bonded not only to the substrate 70 but also to the layer 72. Thus, during normal cleaning of the mask 34, portion 76 remains firmly attached to the mask. In fact, a mask treated in accordance with this invention was subjected to immersion in hot and cold RT2* (chromic sulfuric acid mixture), hand scrubbing, and cleaning in Ultratech Model 602 and 603 plate cleaners operating at pressures up to 2400 psi. The corrected clear defects passed standard optical inspection both before and after cleaning.

*RT2 is a Trade Mark of Allied Chemical Corp.

Figure 5:
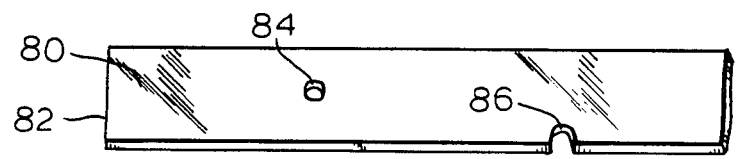
FIG. 5 shows a partial plan view of a mask with clear defects.
Figure 6:
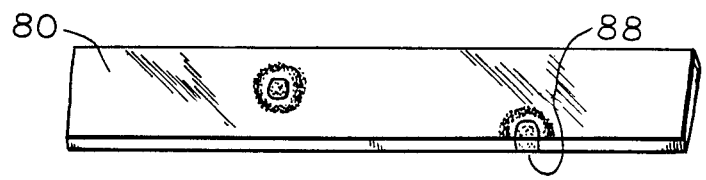
FIG. 6 shows a partial plan view of the mask of FIG. 5 immediately after the clear defects have been corrected in accordance with this invention.

In FIGS. 5–6 some actual clear faults and their correction according to this invention are illustrated. In FIG. 5, there is an opaque strip 80 on a substrate (not shown) said strip having two types of clear faults: a micrometer size pin-hole 84 and a so-called mouse nip 86 extending a few tenth of a micrometer into strip 80. FIG. 6 shows the strip 80 after patches have been applied to the faults as described above. The edge 88 was trimmed using YAG laser 16 and beam shaping aperture 26.

For clear faults having a clear area too large to be covered in a single exposure, the above described process can be used to form a continuous deposition strip by feeding gas continuously to the shroud and moving the mask under the focused beam (or vice-versa) in a raster scan pattern to cover the defect.

FIG. 7 shows the details of shroud assemblies 56 mounted around objectives 104, all attached to the microscope nosepiece 52. The objectives are rotatable around an axis 100 in the usual manner. Mask 34 is placed under objective 104 and stainless steel tubing 58 (1/16 in. o.d., 0.010 in. i.d.) is used to bring the process gas to the area under the objective. Vented chamber 92 is proximity-coupled to shroud 56 through a window 94. Process gas, gaseous products of decomposition and ambient air are picked up by the venting system through a concentric opening 96 between the shroud 56 and the objective 104. The shroud 56 and objective 104 assembly are not in any physical contact with the vent chamber 92 and thus any shrouded objective on the nosepiece 100 can be brought into the active position and used in the repair process.

Figure 3:
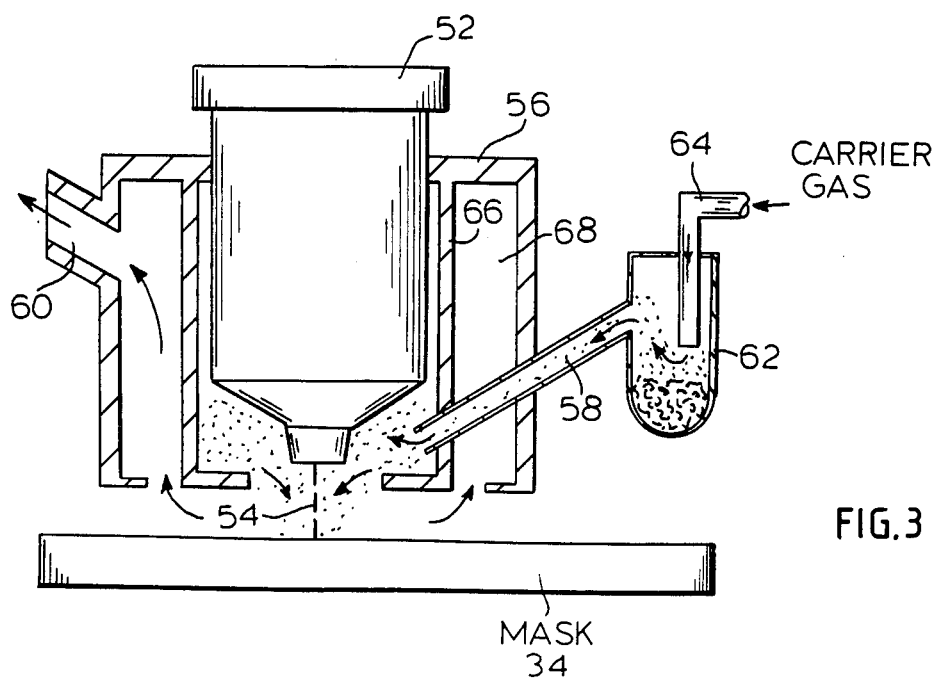
FIG. 3 shows a schematic view of an alternate embodiment of the invention.
Figure 8B:
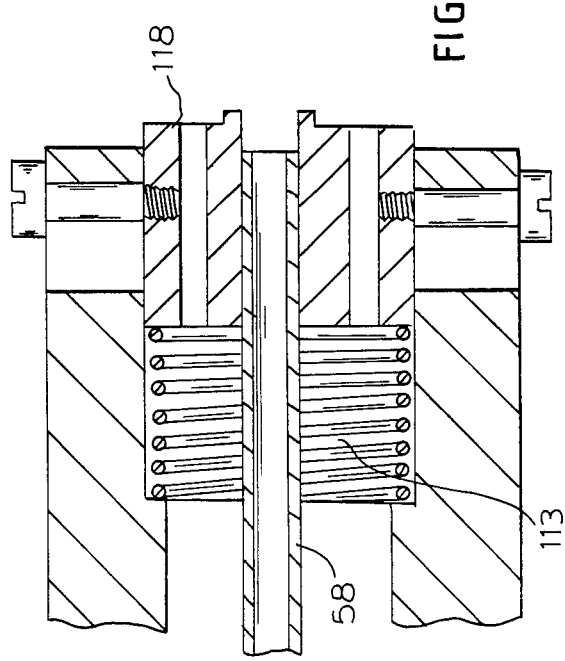
FIG. 8 shows details of a microscope shroud in accordance with the embodiment of FIG. 3.

FIG. 8, corresponding to FIG. 3 schematic, shows details of the process gas input to the inner chamber 66 of shroud 56 through tube 112 which is pressure coupled to tube 58. Tube 58 is again used to bring the process gas to the microscope area. The volume enclosed between microscope objective 104 and mask 34 is flooded by process gas through opening 116 and venting is effected through opening 114 and subsequently through a vent chamber 113 in the same manner as in FIG. 7. FIG. 8b shows a detail of the coupling, a spring-loaded plunger 118, which slides on tube 58. FIG. 8c shows a detail of the seal effected by the sliding plunger 118 between delivery tubes 58 and 112. Also pictured is the proximity coupling of the vented chamber 113 and outer shroud chamber 68.

Figure 9:
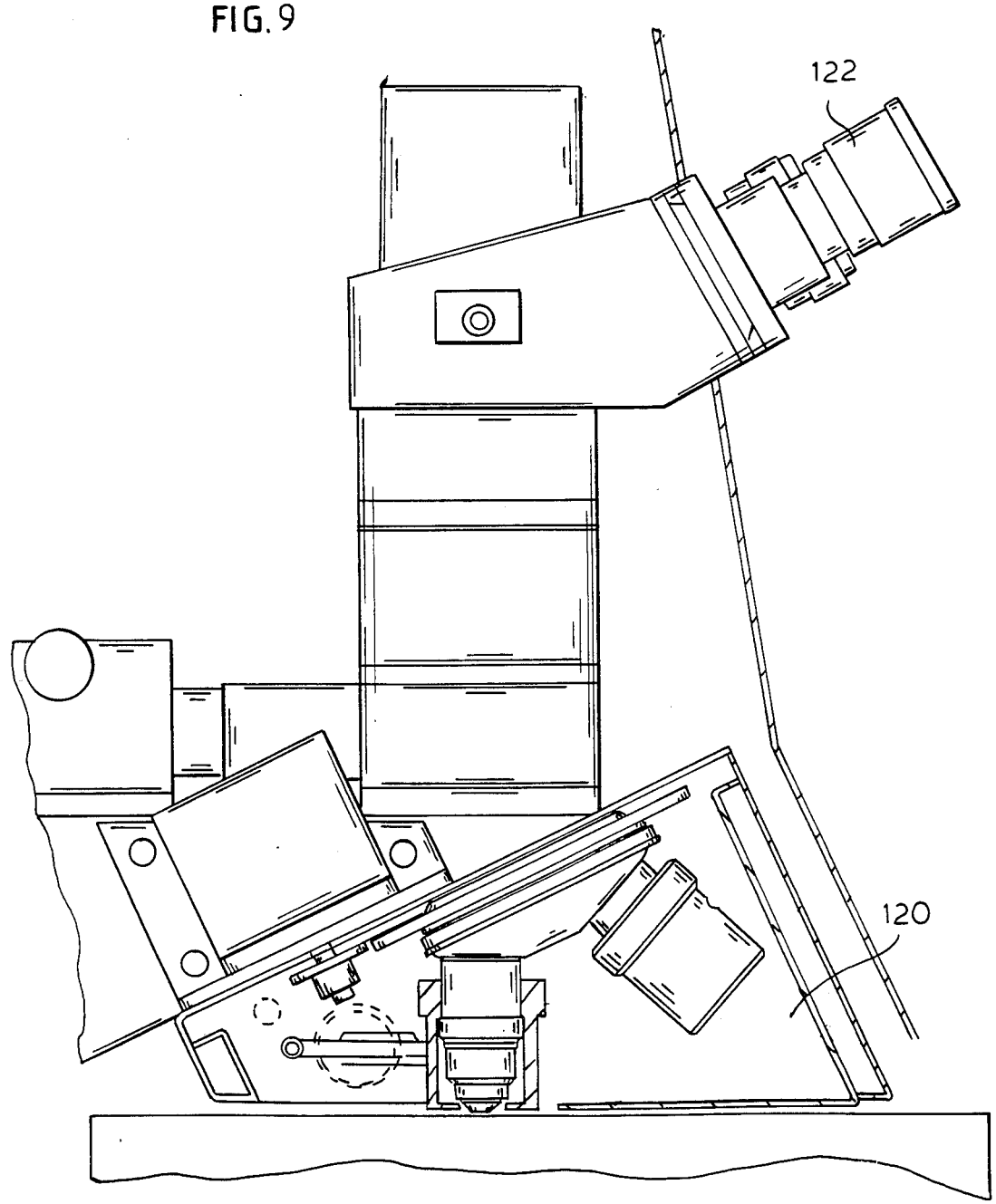
FIG. 9 shows a side view of a microscope with a shroud shown in FIG. 3.

FIG. 9 shows the location of shrouded objective lenses with respect to a standard microscope. The operator uses binocular viewing eyepieces 122 to observe and guide the process. A larger vented enclosure 120 can also be added as an extra safety measure to protect the operator from contact with any of the process gases.

Figure 10:
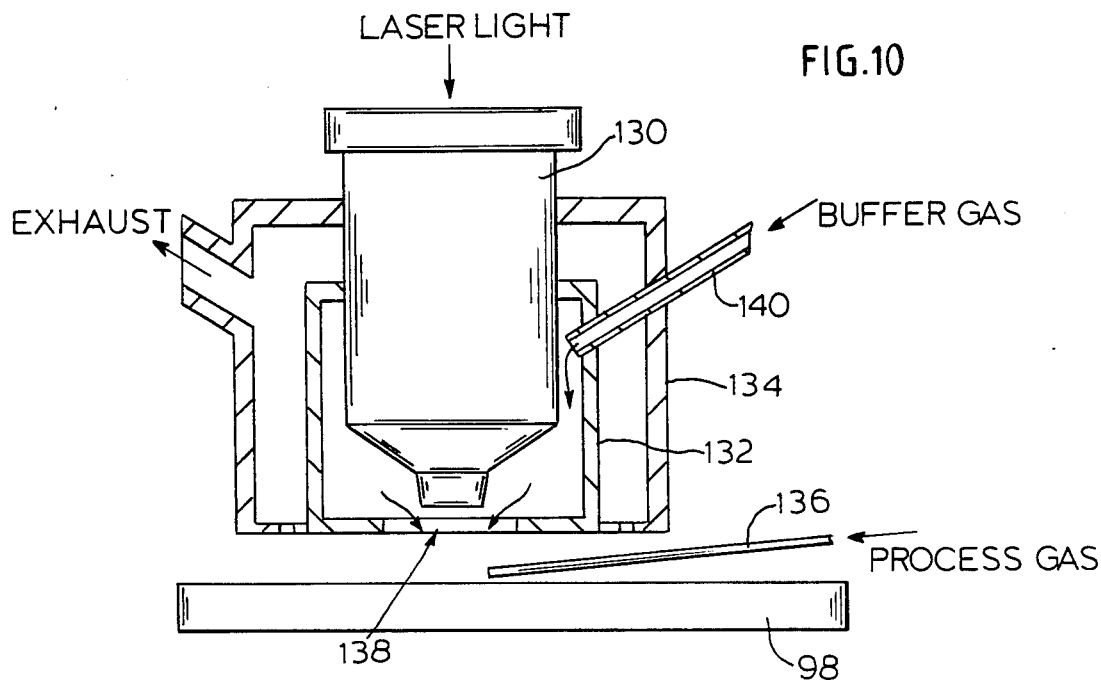
FIG. 10 shows a schematic view of a third embodiment of the invention with means for protecting the microscope objective.

FIG. 10 shows a protection scheme for a refractive objective used in a photolytic repair process. Process gas is brought to the focal region by stainless steel tubing 136, protective flow of buffer gas is injected into the inner chamber 132 by tubing 140 and flows out through opening 138 over mask 98. External shroud 134 is again used for venting.

Figure 11:
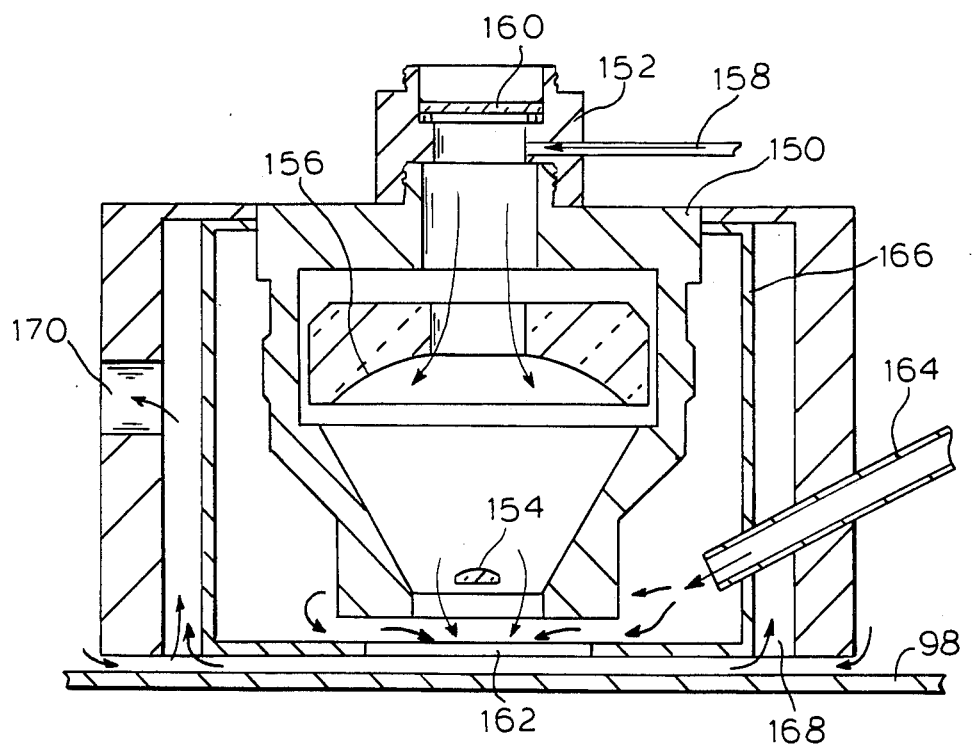
FIG. 11 shows a schematic view of a fourth embodiment of the invention wherein a reflective-type microscope objective is used.

FIG. 11 shows a protective scheme for a reflective type microscope objective used in the photolytic process. Objective 150 is fitted with adapter 152 which is sealed from above with window 160. Tube 158 brings buffer gas flow into the objective to protect mirrors 154 and 156. Process gas is injected into shroud 166 by tube 164 and and the process by-products are vented away through opening 168. Connections to delivery tubes 158 and 164 are made with flexible tubing to allow for objective changes. Port 170 allows venting through a venting chamber (not shown) in a manner identical to the scheme shown in FIG. 7.

Obviously, numerous modification may be made to this invention without departing from its scope as defined in the appended claims.

What is claimed is:

1. A method of preparing a surface for coating by creating a volume of controlled atmosphere, at substantially ambient temperature and pressure, without using a gas-tight cell, comprising:
   delivering a gas mixture including an effective amount of organometallic gas to the volume between a microscope objective and the surface, on which deposits are to be made or which is to be etched or otherwise modified, so that air, normally contained therein, is partially or fully displaced by said gas mixture; inducing a reaction in said gas mixture such that deposits are made therefrom onto the surface; and surrounding said objective by one or more shrouds, at least one of which is used to collect all the gaseous components produced in reactions occurring in said volume together with an unused portion of the said gas mixture and to safely vent them away.

2. The method of claim 1 wherein said objective is kept clear of said gas mixture by additional flow of buffer gas.

3. The method of claim 1 wherein said objective is used to deliver laser radiation to said surface to effect heating or photoactivation of said surface.

4. The method of claim 2 wherein said objective is used to deliver laser radiation to the vicinity of said surface to effect photolytic or combination photolytic/pyrolytic decomposition or activation of components of said gas mixture.

5. A method of correcting clear faults on a photolithographic mask without a gas-tight cell comprising:
   providing a gas mixture at substantially ambient pressure and temperature in a region adjacent to said clear fault, said gas mixture including an effective amount of organometallic compound; and
   heating said mixture to decompose said organometallic compound into a metallic layer which deposits on said clear fault.

6. The method of claim 5 wherein said heating includes the step of applying a laser beam to said compound.

7. The method of claim 5 wherein said organometallic compound is selected from chromium hexacarbonyl, and molybdenum hexacarbonyl.

8. The method of claim 5 wherein said compound is a mixture of molybdenum hexacarbonyl and chromium hexacarbonyl.

9. The method of claim 5 when said mixture further includes a carrier gas selected from the group of argon, helium and nitrogen.

10. A system for correcting opaque and clear defects on a photolithographic mask comprising:
    a first laser beam source;
    a second laser beam source;
    a laser beam delivery system for selective delivery of a laser beam from one of said first and second laser beam sources to said objective; and
    a source of an organometallic gas mixture coupled to the volume between said objective and mask;
    means for correcting opaque defects by directing the laser beam from the first source through said objective said laser beam removing excessive material from said mask; and
    means for correcting clear defects by directing the laser beam from the second source through said objective; and
    means for providing organometallic gas at substantially ambient pressure and temperature from said source to said volume, said laser beam from said second source decomposing said gas to deposit a layer of opaque material on said clear fault.

11. The system of claim 10 wherein said first laser source comprises an Nd:YAG laser and an SHG crystal.

12. The system of claim 10 wherein said second source includes an argon laser.

13. The system of claim 10 wherein said laser delivery system comprises several microscope objectives having different magnifications.

14. The system of claim 13 wherein one or more of said objectives is individually surrounded by said shroud.

15. The system of claim 14 wherein said shroud comprises a first pipe for coupling to said gas source, and an exhaust pipe.

16. The system of claim 15 wherein said shroud further comprises a cylindrical chamber disposed coaxially around said objective for concentrating said gas.

17. The system of claim 16 further comprising means for delivery a buffer gas to said objective to keep active gases away from said objective.

18. The system of claim 14 further comprising a vent chamber for exhausting gases from the shroud and coupling means for coupling said venting chamber to one of said shrouds.

19. The system of claim 10 wherein said laser delivery system comprises an objective with reflective mirrors and means for supplying a buffer gas to said objective to keep gases away from said mirrors.

* * * * *